US012446268B2

(12) United States Patent
Tu et al.

(10) Patent No.: US 12,446,268 B2
(45) Date of Patent: Oct. 14, 2025

(54) SOURCE AND DRAIN EPITAXIAL LAYERS

(71) Applicant: TAIWAN SEMICONDUCTOR MANUFACTURING CO., LTD., Hsinchu (TW)

(72) Inventors: Wen-Hsien Tu, Hsinchu (TW); Chee-Wee Liu, Taipei (TW); Fang-Liang Lu, New Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/055,036

(22) Filed: Nov. 14, 2022

(65) Prior Publication Data
US 2023/0074496 A1  Mar. 9, 2023

Related U.S. Application Data

(62) Division of application No. 16/657,372, filed on Oct. 18, 2019, now Pat. No. 11,502,197.

(51) Int. Cl.
*H10D 30/00* (2025.01)
*H01L 21/02* (2006.01)
(Continued)

(52) U.S. Cl.
CPC ..... *H10D 30/797* (2025.01); *H01L 21/02675* (2013.01); *H10D 30/024* (2025.01); *H10D 30/6211* (2025.01)

(58) Field of Classification Search
CPC ........... H01L 29/7848; H01L 29/66795; H01L 29/7851
See application file for complete search history.

(56) References Cited

U.S. PATENT DOCUMENTS 7,015,116 B1   3/2006 Lo et al.
8,962,400 B2   2/2015 Tsai et al.
(Continued)

FOREIGN PATENT DOCUMENTS

CN    101145517 A    3/2008
CN    101473428 A    7/2009
(Continued)

OTHER PUBLICATIONS

Tan, Philip Beow Yew, et al., "Measuring STI Stress Effect on CMOS Transistor by Stepping through the Channel Width," 2006 International RF and Microwave Conference Proceedings (Sep. 12-14, 2006), 3 pages.
(Continued)

*Primary Examiner* — Trang Q Tran
(74) *Attorney, Agent, or Firm* — Sterne, Kessler, Goldstein &Fox P.L.L.C.

(57) ABSTRACT

The present disclosure is directed to semiconductor structures with source/drain epitaxial stacks having a low-melting point top layer and a high-melting point bottom layer. For example, a semiconductor structure includes a gate structure disposed on a fin and a recess formed in a portion of the fin not covered by the gate structure. Further, the semiconductor structure includes a source/drain epitaxial stack disposed in the recess, where the source/drain epitaxial stack has bottom layer and a top layer with a higher activated dopant concentration than the bottom layer.

20 Claims, 11 Drawing Sheets

(51) Int. Cl.
*H10D 30/01* (2025.01)
*H10D 30/62* (2025.01)
*H10D 30/69* (2025.01)

(56) References Cited

U.S. PATENT DOCUMENTS

| | | |
|---|---|---|
| 9,093,514 B2 | 7/2015 | Tsai et al. |
| 9,236,267 B2 | 1/2016 | De et al. |
| 9,245,805 B2 | 1/2016 | Yeh et al. |
| 9,418,897 B1 | 8/2016 | Ching et al. |
| 9,520,482 B1 | 12/2016 | Chang et al. |
| 9,812,363 B1 | 1/2017 | Liao et al. |
| 9,576,814 B2 | 2/2017 | Wu et al. |
| 9,608,116 B2 | 3/2017 | Ching et al. |
| 9,711,608 B1 | 7/2017 | Duriez et al. |
| 9,859,380 B2 | 1/2018 | Lee et al. |
| 2007/0298575 A1 | 12/2007 | Nouri et al. |
| 2008/0070423 A1 | 3/2008 | Crowder et al. |
| 2008/0121932 A1 | 5/2008 | Ranade |
| 2010/0193882 A1 | 8/2010 | Hoentschel et al. |
| 2013/0288438 A1 | 10/2013 | Jensen et al. |
| 2013/0292698 A1 | 11/2013 | Then et al. |
| 2014/0106529 A1 | 4/2014 | Morin et al. |
| 2014/0264348 A1 | 9/2014 | Tsai et al. |
| 2015/0255602 A1 | 9/2015 | JangJian et al. |
| 2016/0211371 A1 | 7/2016 | Tsai et al. |
| 2017/0084741 A1 | 3/2017 | Lin et al. |
| 2017/0213739 A1 | 7/2017 | Gluschenkov et al. |
| 2018/0151378 A1* | 5/2018 | Huang ............... H01L 27/0924 |
| 2018/0166575 A1 | 6/2018 | Colinge et al. |
| 2018/0286861 A1 | 10/2018 | Choi et al. |
| 2019/0035892 A1 | 1/2019 | Tang |
| 2019/0067436 A1 | 2/2019 | Wu et al. |
| 2019/0165099 A1 | 5/2019 | Chen et al. |
| 2019/0267471 A1 | 8/2019 | Chan et al. |
| 2020/0303509 A1 | 9/2020 | Mehandru et al. |

FOREIGN PATENT DOCUMENTS

| | | |
|---|---|---|
| CN | 101517717 A | 8/2009 |
| CN | 103000675 A | 3/2013 |
| CN | 103730352 A | 4/2014 |
| CN | 104011867 A | 8/2014 |
| CN | 107026086 A | 8/2017 |
| CN | 107464840 A | 12/2017 |
| CN | 109427662 A | 3/2019 |
| CN | 110212029 A | 9/2019 |
| KR | 20110113761 A | 10/2011 |
| KR | 20170083991 A | 7/2017 |
| KR | 20180112897 A | 10/2018 |
| TW | 201926695 A | 7/2019 |

OTHER PUBLICATIONS

Luo, Jie-Xin, et al., "The Impact of Shallow-Trench-Isolation Mechanical Stress on the Hysteresis Effect of Partially Depleted Silicon-on-Insulator n-Type Metal-Oxide-Semiconductor Field Effects," CHIN.PHYS.LETT. vol. 31, No. 12 (2014) 126601, 4 pages.

Yang, Wenwei, et al., "Analysis of GIDL Dependence on STI-induced Mechanical Stress," Institute of Microelectronics, Tsinghua University, Beijing, China, (2005), 4 pages.

Lu, Chun-Ti, et al., "Process Simulation of Pulsed Laser Annealing on Epitaxial Ge on Si," ECS Journal of Solid State Science and Technology, vol. 6(8) (2017), 4 pages.

Donovan, E.P., et al., "Heat of Crystallization and Melting Point of Amorphous Silicon," Appl. Phys. Lett. 42(8) (1983), 3 pages.

Posselt, M. et al., "Atomistic Simulation of Amorphous Germanium and Its Solid Phase Epitaxial Recrystallization," Phys. Rev. B 80, 045202 (2009), 12 pages.

\* cited by examiner

SOURCE AND DRAIN EPITAXIAL LAYERS

CROSS-REFERENCE TO RELATED APPLICATION

This patent application is a divisional of U.S. patent application Ser. No. 16/657,372, filed on Oct. 18, 2019 and titled "Source and Drain Epitaxial Layers," which is incorporated by reference herein in its entirety.

BACKGROUND

Dopants in a semiconductor material can function as donors or acceptors only when they are part of the semiconductor's lattice structure. For this reason, dopants in a semiconductor material (e.g., silicon) need to be activated. An activated dopant can act as a donor or acceptor of electrons—e.g., behave as an n-type or p-type dopant with respect to the semiconductor material. If the dopant occupies interstitial space in the semiconductor material, it is not considered activated and it is ineffective as a dopant (e.g., it cannot function as a donor or acceptor). Thermal energy can be provided to a doped semiconductor material to move the dopants from interstitial space to crystal sites, a process referred to as "activation" or "crystal activation."

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

DETAILED DESCRIPTION

Figure 1:
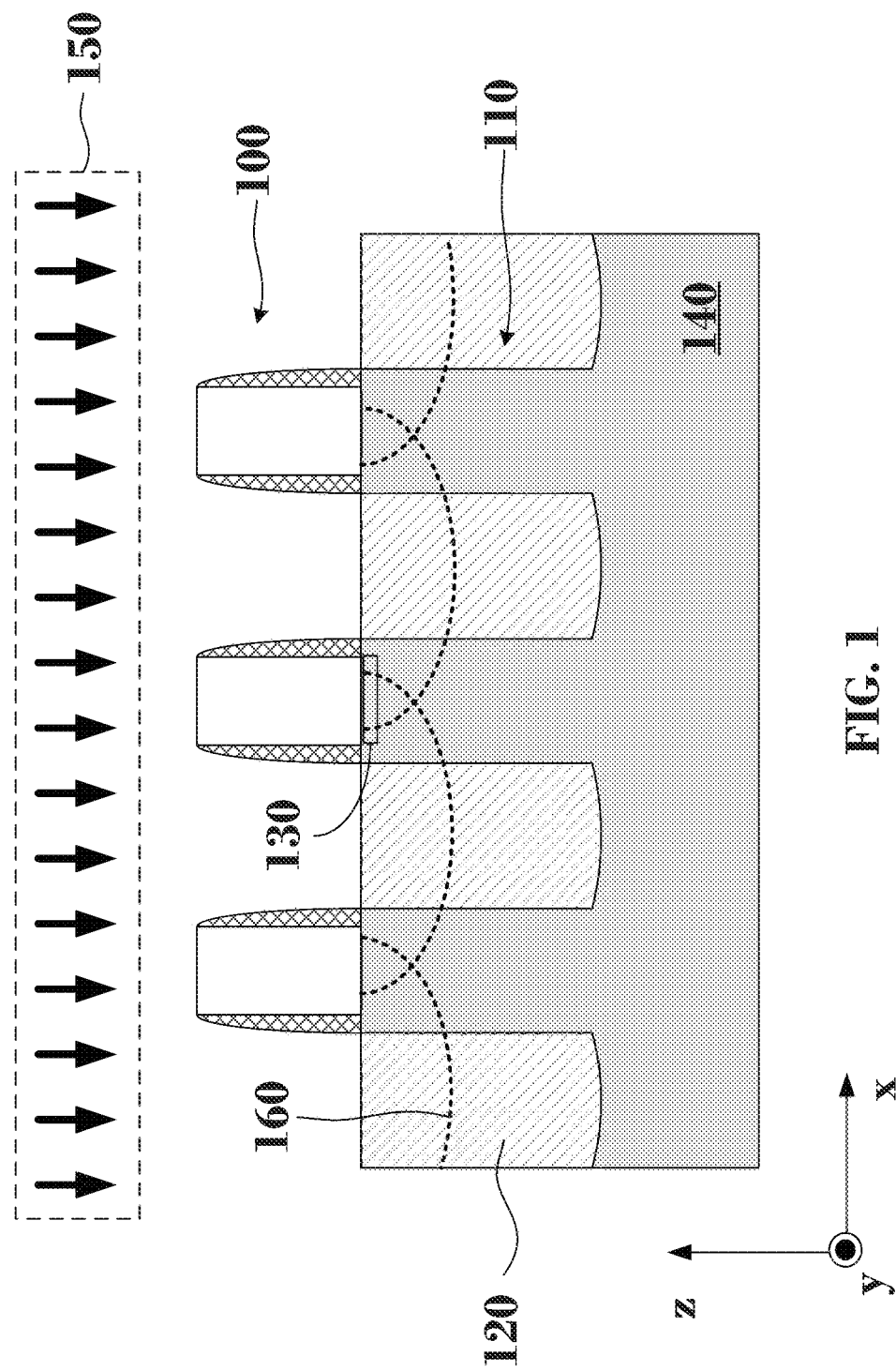
FIG. 1 is partial cross-sectional view of an exemplary array of transistor structures formed on fins and having single-crystalline source/drain stacks during a laser annealing process, in accordance with some embodiments.

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature on a second feature in the description that follows may include embodiments in which the first and second features are formed in direct contact, and may also include embodiments in which additional features may be formed that are between the first and second features, such that the first and second features are not in direct contact.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

In some embodiments, the terms "about" and "substantially" can indicate a value of a given quantity that varies within 5% of the value (e.g., ±1%, ±2%, ±3%, ±4%, ±5% of the value). In some embodiments, the terms "about" and "substantially" indicate other values based on capability provided by, for example, a fabrication process, a fabrication operation, or a fabrication tool.

The term "vertical," as used herein, means nominally perpendicular to the surface of a substrate.

Diffusion is a fundamental property that describes the movement of one material (e.g., a dopant) through another (e.g., a semiconductor host). Diffusion occurs from regions of relatively high dopant concentration into regions of low dopant concentration. Different dopant species can have different diffusivities within a semiconductor host material like silicon (Si), silicon germanium (SiGe), silicon-carbon (SiC), or silicon-phosphorous (SP); and the higher the diffusivity, the faster the dopant moves into the semiconductor host material. Since the diffusion rate of dopant species in a semiconductor host material increases with temperature, thermal diffusion is the primary mechanism used in semiconductor fabrication to move the dopant species through the semiconductor's lattice. There are two basic methods for providing thermal energy for dopant diffusion: furnace anneal and rapid thermal anneal (RTA).

Furnace anneal is a method of annealing the semiconductor host material (e.g., a semiconductor wafer) in a hot-wall furnace, for example, between about 800° C. and about 910° C. for a duration of about 30 min. However, annealing cycles with such duration and temperature can cause extensive (e.g., not tightly controlled) dopant diffusion that is undesirable for some integrated circuit fabrication processes (e.g., the source/drain activation). Further, furnace anneals do not apply heat locally, but globally. That is, every layer and/or structure that is present on the semiconductor material at the time of the furnace anneal is subjected to the elevated temperatures for the duration of the annealing process. This can pose limitations to integrated circuit (IC) fabrication.

An RTA process anneals the semiconductor material by using a fast ramp (e.g., in the millisecond (ms) or nanosecond (ns) range) and a short dwell time (e.g., in the second or sub-second range) at the target temperature (e.g., at about 910° C. or more). Further, RTA can be selective and provide heat locally or globally. Types of RTA include thermal annealing with lamps (e.g., tungsten halogen lamps) or a laser (e.g., laser anneal). RTA with lamps can be a global anneal because the semiconductor surfaces (e.g., the top, the bottom, or both) are exposed to the lamps at once. Laser anneal, on the other hand, provides location accuracy and heat transfer precision due its beam size (e.g., between about 25 mm$^2$ and about 100 mm$^2$) and precise energy output. Because of this characteristic, laser annealing is a preferred method for source/drain dopant activation in IC fabrication.

By way of example and not limitation, during a laser annealing process, a pulsed laser beam scans the semiconductor surface (e.g., the surface of the semiconductor wafer) at a pace of about 100 mm/s. Due to the laser's beam size (e.g., between about 25 mm$^2$ and about 100 mm$^2$), localized annealing can be achieved. The annealing depth can be controlled via process conditions, such as the laser energy or wavelength, the number of pulses per site, and the dwell time (e.g., the time the laser spends on each site) of the laser beam.

However, dopant activation for source/drain epitaxial layers can be challenging even with a laser annealing process. This is because a transistor's source/drain regions are small compared to the laser's beam size. This problem is exacerbated by the size of transistors, and their source/drain regions, which shrink with each technology generation (e.g., with each technology node). For example, as the source/drain regions shrink, the heat from the laser beam can spread to areas outside the source/drain regions, such as the fin region located between the source and drain regions of the transistor. This can be described with FIG. 1, which is a partial cross-sectional view along the x-axis of an exemplary array of transistors structures 100 formed on fins 110 and having single-crystalline source/drain stacks 120 and channel regions 130. Fins 110 are disposed on a substrate 140. When laser beam 150 begins scanning the surface of substrate 140, the heat produced by laser beam 150 forms a molten front 160 that extends outside single-crystalline source/drain stacks 120 (e.g., extends to fins 110 and channel region 130). As a result, fin 110 can deform, which compromises the transistor's electrical characteristics. In order to reduce fin deformation, the laser annealing conditions need to be modified so the heat generated by the laser beam is reduced and molten front 160 is better controlled. Decreasing however the heat generated by the laser beam can impact the dopant activation process within single-crystalline source/drain stacks 120. For example, fewer dopants will be activated as a result of such change.

To address these challenges, the embodiments described herein are directed to the formation of source/drain epitaxial stacks with a low-melting point "top" layer and a high-melting point "bottom" layer. In some embodiments, the low-melting top layer is polycrystalline or amorphous as-deposited and the high-melting point bottom layer is single-crystalline as-deposited. In other embodiments, both low-melting point top and high-melting point bottom layers are single-crystalline or polycrystalline as-deposited but with different stoichiometry. In some embodiments, the as-deposited amorphous low-melting point top layer re-crystallizes as a result of the laser annealing process and exhibits a higher defect density compared to the high-melting point bottom layer. Further, the low-melting point top layer, as a result of the laser annealing process, exhibits a higher activated dopant concentration compared to the high-melting point bottom layer. In some embodiments, only the dopants in the low-melting point top layer are activated during the laser annealing process. According to some embodiments, for the source/drain epitaxial stacks disclosed herein, a laser beam with a reduced power can be used. As a result, fin deformation during the laser annealing process can be avoided.

Figure 2:
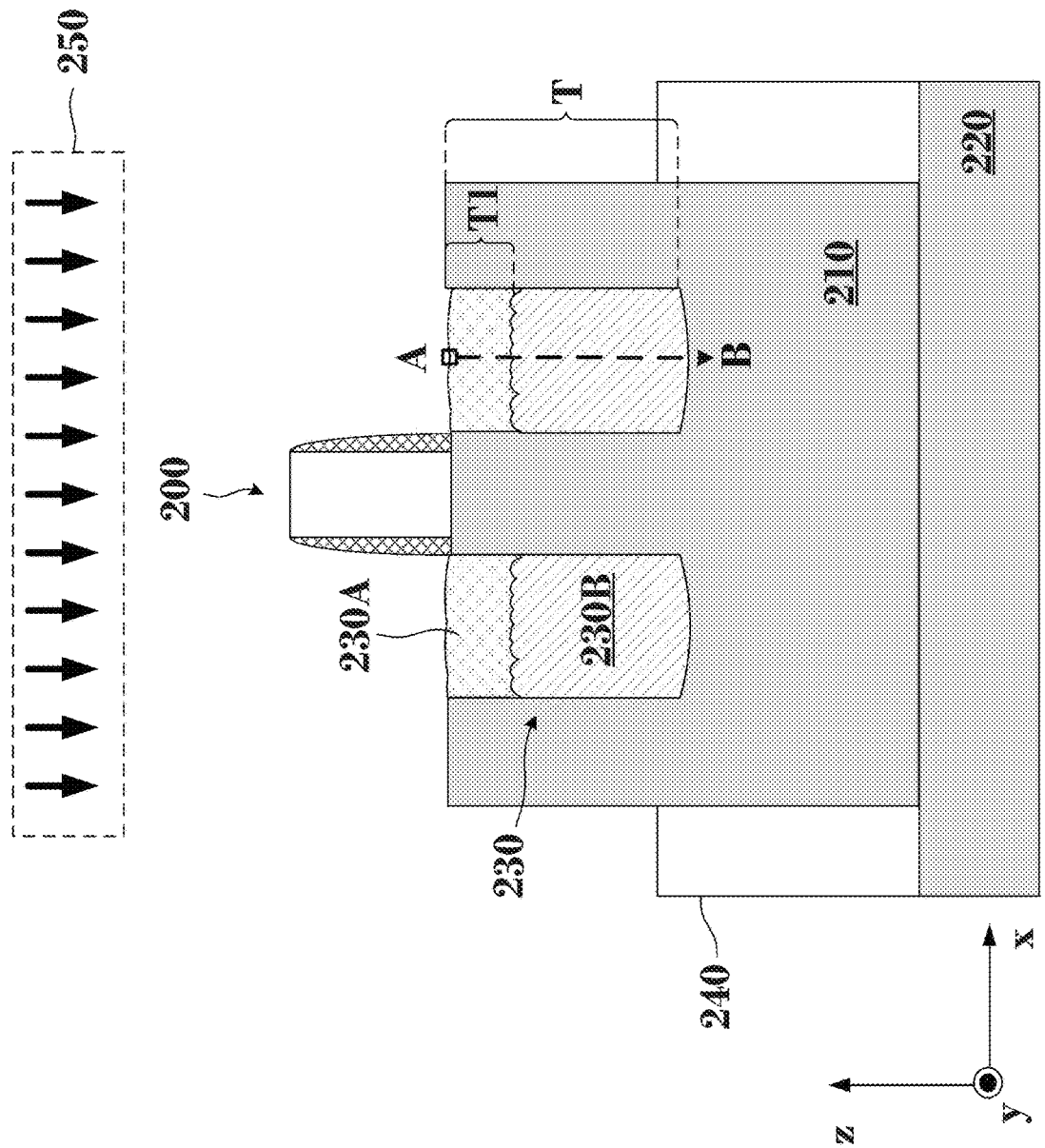
FIG. 2 is partial cross-sectional view of a transistor structure having source/drain epitaxial stacks with an amorphous low-melting point top layer and a single-crystalline high-melting point bottom layer during a laser annealing process, in accordance with some embodiments.

FIG. 2 is a cross-sectional view across the x-axis of an exemplary transistor structure 200 formed on semiconductor fin 210. It is noted that the length of the fin is parallel to the x-axis shown in FIG. 2. Semiconductor fin 210 is disposed on semiconductor substrate 220 and is recessed to facilitate the formation of source/drain epitaxial stacks 230. Semiconductor fin 210 is isolated from other transistor structures laterally via isolation layer 240. In some embodiments, each source/drain epitaxial stack 230 includes an as-deposited amorphous low-melting point top layer 230A and an as-deposited single-crystalline high-melting point bottom layer 230B. As used herein, a "top" layer refers to a layer that is positioned (or disposed) further away, along the z-axis, from semiconductor substrate 220, and a "bottom" layer refers to a layer positioned (or disposed) closer, along the z-axis, to semiconductor substrate 220. Further, the term "amorphous," as used herein, also encompasses a polycrystalline microstructure (e.g., a microstructure with a short range lattice periodicity).

According to some embodiments, the dopants and the semiconductor host material included in source/drain epitaxial stack 230 can be chosen based on the type of transistor structure 200—for example, whether transistor structure 200 is n-type field effect transistor (nFET) or a p-type field effect transistor (pFET). In some embodiments, the source/drain epitaxial stack of an nFET (e.g., an n-type source/drain epitaxial stack) includes strained silicon-carbon (SiC) or strained silicon-phosphorous (SiP) layers doped with phosphorous (P), and a source/drain epitaxial stack of a p-type field effect transistor (pFET) (e.g., a p-type source/drain epitaxial stack) includes strained silicon-germanium (SiGe) layers doped with boron (B). According to some embodiments, the amount of P incorporated into an n-type source/drain epitaxial stack can be up to about $1 \times 10^{21}$ atoms/cm$^3$ and the amount of B incorporated into a p-type source/drain epitaxial stack can be up to about $1 \times 10^{21}$ atoms/cm$^{-3}$. By way of example and not limitation, P and B dopants can be incorporated into the layers of source/drain epitaxial stacks 230 during growth with suitable precursors. Further, both amorphous low-melting point top layer 230A and single-crystalline high-melting point bottom layer 230B can be grown to have a substantially equal amount of P or B concentration.

In some embodiments, as-deposited amorphous low-melting point top layer 230A has a melting point of about 1420 K (e.g., about 1147° C.) and single-crystalline high-melting point bottom layer 230B has a melting point greater than about 1687 K (e.g., 1414° C.); however, both layers include the same material and have a substantially equal stoichiometry—e.g., a substantially equal Si/Ge ratio for a SiGe source/drain epitaxial stack; and a substantially equal Si/C ratio for a SiC source/drain epitaxial stack or a substantially equal Si/P ratio for a SiP source/drain epitaxial stack. According to some embodiments, the melting point difference between the top and bottom layers in source/drain epitaxial stacks 230 is attributed to their microstructure (e.g., amorphous as opposed to single-crystalline). In this example, single-crystalline high-melting point bottom layer 230B has a higher melting point (e.g., a difference of about 267 K or about 267° C.) compared to amorphous low-melting point top layer 230A. However, this is not limiting and a lower melting point difference may be used between the low-melting point layer and the high-melting point layer—e.g., greater than about 200 K. A melting point difference greater than the threshold of about 200 K (e.g., 267 K) ensures that a melting front is "selectively" formed and contained within amorphous low-melting point top layer 230A by the laser beam during a laser annealing process, while single-crystalline high-melting point bottom layer 230B remains a solid. If the melting point difference between the aforementioned layers is equal to or less than about 200 K, the melting front formed by the laser beam may extend beyond the boundaries of amorphous low-melting point top layer 230A—for example, into high-melting point bottom layer 230B and the fin region. As discussed earlier, this is undesirable. Therefore, the aforementioned selectivity can be achieved as long as the heat generated by the laser beam during the laser annealing process raises the temperature of source/drain epitaxial stack 230 above the melting point of amorphous low-melting point top layer 230A and below the melting point of single-crystalline high-melting point bottom layer 230B. In some embodiments, the temperature of source/drain epitaxial stack 230 during the laser annealing process is equal to or greater than the melting point of amorphous low-melting point top layer 230A, and equal to or less than the melting point of single-crystalline high-melting point bottom layer 230B (e.g., melting point temperature of the amorphous low-melting point top layer-≤temperature of the laser annealing process 5 melting point temperature of single-crystalline high-melting point bottom layer). In this operation window, a molten region, like molten front 160 shown in FIG. 1, can be formed within the boundaries of amorphous low-melting point top layer 230A. In some embodiments, the melting point of amorphous low-melting point top layer 230A is also lower than the melting point of surrounding materials like semiconductor fin 210, which in the case of crystalline silicon can be about 1687 K (e.g., closer to the melting point of single-crystalline high-melting point bottom layer 230B). Therefore, during the laser annealing process, deformation of semiconductor fin 210 can be minimized or avoided.

Since the formation of a melting front in amorphous low-melting point top layer 230A requires less heat—e.g., due to the amorphous layer's melting point—the power of the laser beam can be reduced. For example, if a source/drain epitaxial stack includes only single-crystalline layers, like single-crystalline high-melting point bottom layer 230B, the laser beam would need to operate, for example, at about 910 joules to form a molten front and activate the dopants (e.g., B or P). At that power level, the laser beam would also produce enough heat to deform semiconductor fin 210, which has a substantially comparable melting point to the single-crystalline layers of the source/drain epitaxial stack. On the other hand, for source/drain epitaxial stack 230 that includes an as-deposited amorphous low-melting point top layer 230A and single-crystalline high melting point bottom layer 230B, the laser beam would need to produce less heat and consequently operate at a lower power setting—e.g., at 500 joules, which is about a 50% reduction according to some embodiments.

In some embodiments, amorphous low-melting point top layer 230A is grown to occupy between about 30% and about 75% of the total thickness of source/drain epitaxial stack 230. In other words, and referring to FIG. 2, thickness T1 of as-deposited amorphous low-melting point top layer 230A can be between about 30% and about 75% of total thickness T of source/drain epitaxial stack 230 (e.g., 30% T≤T1≤75% T or 0.30≤T1/T≤0.75). In some embodiments, single-crystalline high-melting point bottom layer 230B acts as a diffusion barrier for the dopants of amorphous low-melting point top layer 230A during a laser annealing process. This is because the molten front is not formed in single-crystalline high-melting point bottom layer 230B and therefore the dopants diffusing into single-crystalline high-melting point bottom layer 230B from amorphous low-melting point top layer 230A are slowed down (e.g., blocked). If thickness T1 of amorphous low-melting point top layer 230A is greater than about 75% of total thickness T of source/drain epitaxial stack 230 (e.g., T1/T≥0.75), then single-crystalline high-melting point bottom layer 230B will not be sufficiently thick to block the diffusion of dopants from amorphous low-melting point top layer 230A. As a result, fewer dopants will be activated within amorphous low-melting point top layer 230A-which in turn can increase the resistance of source/drain epitaxial stack 230. Further, diffusion of dopants can form undesirable leakage paths between source/drain epitaxial stacks 230 and doped regions of semiconductor fin 210 and/or semiconductor substrate 220. In addition, a thicker amorphous low-melting point top layer 230A may require a longer dwell time and/or higher power setting for the laser beam during a laser annealing process, both of which can adversely impact processing time and cost. On the other hand, if thickness T1 of amorphous low-melting point top layer 230A is less than about 30% of total thickness T (e.g., T1/T≤30%), the amount of dopants activated in the top layer can be insufficient to provide an acceptable resistance for source/drain epitaxial stack 230.

In some embodiments, the microstructure—and consequently the melting point—of as-deposited amorphous low-melting point top layer 230A and single-crystalline high-melting point bottom layer 230B can be adjusted via their respective growth conditions, such as the growth temperature and pressure. For example, and according to some embodiments, single-crystalline high-melting point bottom layer 230B can be grown at a temperature between about 650° C. and about 800° C. and at a pressure between about 20 Torr and about 300 Torr. In contrast, an amorphous low-melting point top layer 230A can be grown at a temperature between about 450° C. and about 600° C. and at a pressure between about 300 Torr and about 400 Torr. In other words, a single-crystalline layer can be epitaxially grown at a "higher" temperature and "lower" pressure compared to an amorphous epitaxial layer, which can be grown at a "lower" temperature and "higher" pressure. In some embodiments, the aforementioned conditions can be equally applied to the growth of p-type (e.g., B-doped SiGe) and n-type (e.g., P-doped SiC and SiP) source/drain epitaxial layers.

In some embodiments, single-crystalline high-melting point bottom layer 230B and amorphous low-melting point top layers 230A are grown in-situ (e.g., without a vacuum break) in the same processing reactor. Rapid processing temperature changes (e.g., within about 10 s to about 20 s) can be achieved, for example, with the use of heating lamps. In some embodiments, single-crystalline high-melting point bottom layer 230B and amorphous low-melting point top layers 230A are grown by a chemical vapor deposition (CVD) process.

In some embodiments, amorphous low-melting point top layer 230A can be formed with a pre-amorphization implant (PAI) process. For example, a source/drain epitaxial stack 230 may initially include only a single-crystalline layer, like bottom single-crystalline high-melting point bottom layer 230B shown in FIG. 2, having a total thickness T. A PAI process that uses implants consumes a portion of the single-crystalline layer and converts it into an amorphous layer via implant ion bombardment. The type of implants, amount of implants, and the implant energy are parameters that can be used to fine tune the thickness of the amorphous layer.

In some embodiments, Ge or tin (Sn) implants can be used for SiGe source/drain epitaxial stacks and Si implants can be used for SiC or SiP source/drain epitaxial stacks. By way of example and not limitation, a Ge or Sn dose between about $1\times10^{14}$ cm$^{-2}$ and about $5\times10^{14}$ cm$^{-2}$, at an acceleration voltage between about 3 keV and about 20 keV, can be used to form an amorphous low-melting point top layer 230A with thickness T1. A Si dose between about $1\times10^{15}$ cm$^{-2}$ and about $5\times10^{15}$ cm$^{-2}$, at an acceleration voltage between about 1 keV and about 5 keV, can be used to form an amorphous low-melting point top layer 230A with thickness T1. In some embodiments, if a PAI method is used to form amorphous low-melting point top layer 230A, amorphous low-melting point top layer 230A and single-crystalline high-melting point bottom layer 230B may have different Si/Ge and Si/C or Si/P ratios.

After the formation of amorphous low-melting point top layer 230A, source/drain epitaxial stacks 230 are subjected to a laser annealing process—e.g., via a scanning laser beam 250—to activate the dopants in amorphous low-melting point top layer 230A. As discussed above, amorphous low-melting point top layer 230A has a low melting point compared to bottom single-crystalline high-melting point bottom layer 230B (e.g., lower than about 200 K). Further, the power of laser beam 250 has been adjusted based on the melting point difference between the two layers so that a molten front selectively forms on amorphous low-melting point top layer 230A, while single-crystalline bottom layer remains a solid. In some embodiments, laser beam 250 has a wavelength between about 308 nm and about 532 nm and an annealing depth (e.g., measured from a top surface of amorphous low-melting point top layer 230A) between about 7 nm and about 1200 nm. In some embodiments, the annealing depth corresponds to thickness T1 of amorphous top layer 230A. As discussed above, laser beam 250 covers an area between about 25 mm$^2$ and about 100 mm$^2$ (e.g., an area between about 25 mm$^2$ and about 30 mm$^2$) and has a scanning speed of about 100 mm/s. Further, laser beam 250 is pulsed between about 1 and 10 times per site with each pulse having a duration between about 20 ns and 150 ns. By way of example and not limitation, the annealing process can be performed in nitrogen or another inert gas ambient (e.g., argon, helium, xenon, etc.).

The aforementioned laser beam characteristics are not designed to be limiting and values outside these ranges can be used depending on conditions such as: (i) the thicknesses of amorphous low-melting point top layer 230A and single-crystalline high-melting point bottom layer 230B; and (ii) the melting point difference between amorphous low-melting point top layer 230A and single-crystalline high-melting point bottom layer 230B. By way of example and not limitation, for a thicker amorphous low-melting point top layer 230A (e.g., when T 1/T is closer to about 0.75), a longer pulse duration (e.g., about 150 ns) in combination with increased number of pulses (e.g., 10) may be used to achieve a higher annealing depth (e.g., 1200 nm); while for a shallower annealing depth (e.g., about 7 nm), fewer and/or shorter pulses may be used.

The beam's wavelength can also be adjusted to achieve a desired heat output based on other laser beam considerations (e.g., number of pulses, duration of the pulses, scanning speed, etc.) and layer characteristics (e.g., the thickness and the melting point of amorphous low-melting point top layer 230A). For example, assuming that all other laser beam characteristics are equal, a laser beam with a short wavelength (e.g., about 300 nm) having a low absorption depth can be used for a thin amorphous low-melting point top layer 230A (e.g., about 10 nm), and laser beam with a long wavelength (e.g., about 500 nm) having a higher absorption depth can be used for a thick amorphous low-melting point top layer 230A (e.g., about 100 nm). In both conditions, the laser power can be substantially the same and range, for example, between about 200 joules and 400 joules.

In some embodiments, the laser annealing process described above activates the dopants (e.g., B or P) in amorphous low-melting point top layer 230A. The activated carrier concentration in the top layer of source/drain epitaxial stack 230 can range from about $1\times10^{20}$ cm$^{-3}$ to about $1\times10^{21}$ cm$^{-3}$ for both p-type and n-type stacks (e.g., SiGe, SiC or SiP). In some embodiments, the dopant activation process primarily occurs in the low-melting point top layer (e.g., amorphous low-melting point top layer 230A) and only partially in the single-crystalline high-melting point bottom layer (e.g., single-crystalline high-melting point bottom layer 230B). In some embodiments, the low-melting point top layer can develop an activated carrier concentration that is substantially equal to its chemical dopant concentration (e.g., about 100% activation rate), and high-melting point bottom layer can develop an activated carrier concentration that is less that its chemical dopant concentration (e.g., less than 100% activation rate). For example, in the aforementioned case, low-melting point top layer 230A can develop an activated carrier concentration of up to about $1\times10^{21}$ cm$^{-3}$, while the high-melting point bottom layer 230B may be limited to an activated carrier concentration of up to about $1\times10^{20}$ cm$^{-3}$. Therefore, in some embodiments, even though dopant activation occurs throughout source/drain epitaxial stack 230 (e.g., in both the low-melting point and high-melting point layers), low-melting point top layer 230A will develop a higher concentration of activated dopants (e.g., about one order of magnitude higher) compared to high-melting point bottom layer 230B.

Figure 3:
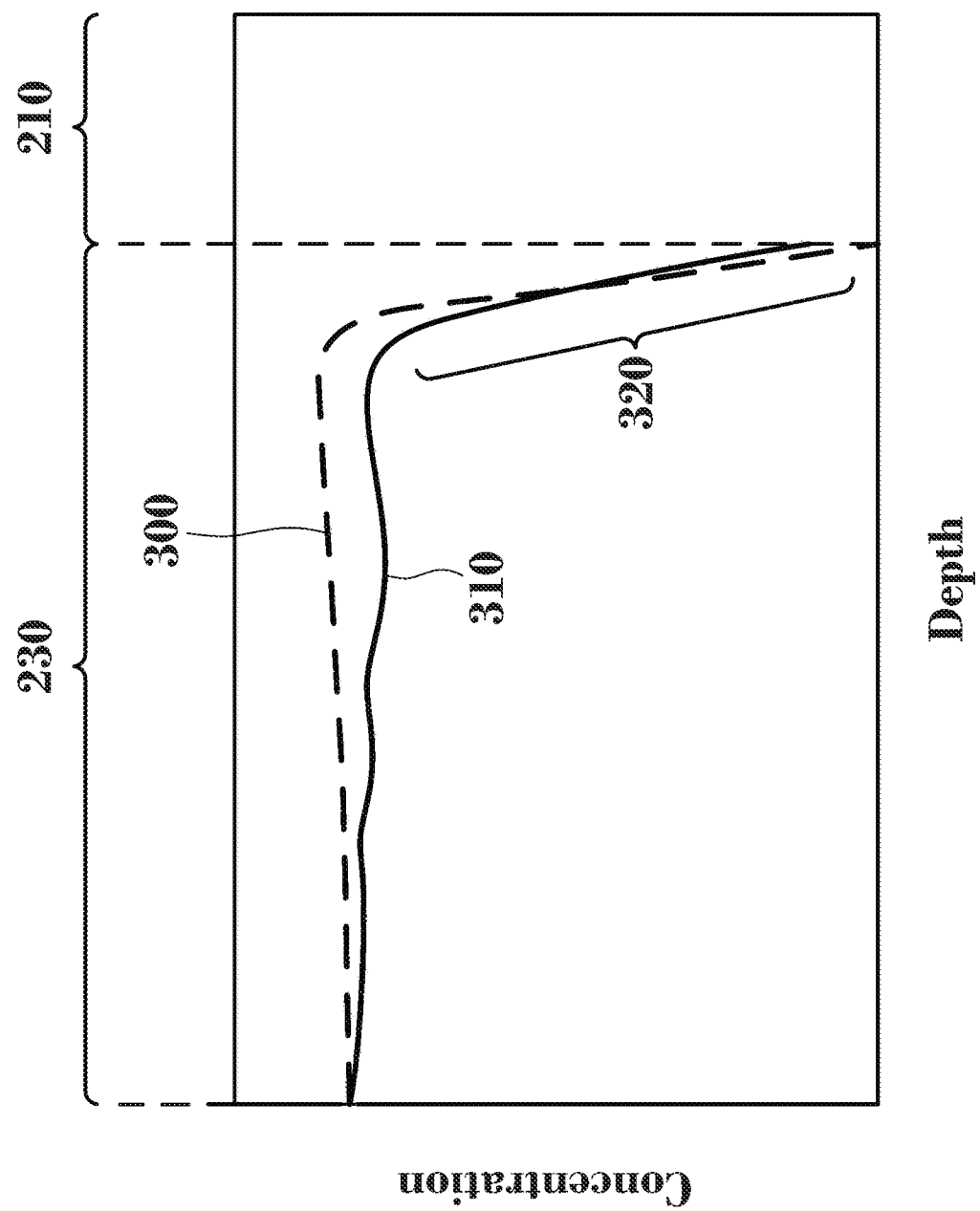
FIG. 3 is a secondary ion mass spectroscopy (SIMS) profile superimposed with a spreading resistivity profile (SRP) for a source/drain epitaxial stack with a low-melting point top layer and a high-melting point bottom layer after a laser annealing process, in accordance with some embodiments.

In some embodiments, dopant diffusion outside the source/drain epitaxial stack can be prevented as demonstrated in FIG. 3, which is a secondary ion mass spectroscopy (SIMS) profile, represented by curve 300, and superimposed with a spreading resistivity profile (SRP), represented by curve 310. The y-axis of FIG. 3 is logarithmic and represents concentration of dopants and activated dopants (e.g., carriers). The x-axis represents a depth within source/drain epitaxial stack 230. For example, the origin of the x-y plot in FIG. 3 corresponds to a top surface of source/drain epitaxial stack 230. In some embodiments, profiles 300 and 310 represent dopant and carrier concentration respectively after an annealing process along a line A-B shown in FIG. 2. More specifically, SIMS curve 300 corresponds to a total dopant concentration (e.g., B or P) across source/drain epitaxial stack 230 and SRP curve 310 corresponds to an activated dopant concentration across source/drain epitaxial stack 230. As shown in FIG. 3, both profiles 300 and 310 show a steep reduction of dopant and carrier concentration at the vicinity of the interface with semiconductor fin 210. In some embodiments, slope 320 is about 2.6 nm/decade and demonstrates that the carrier and dopant concentrations in source/drain epitaxial stack 230 do not diffuse into semiconductor fin 210.

Figure 4:
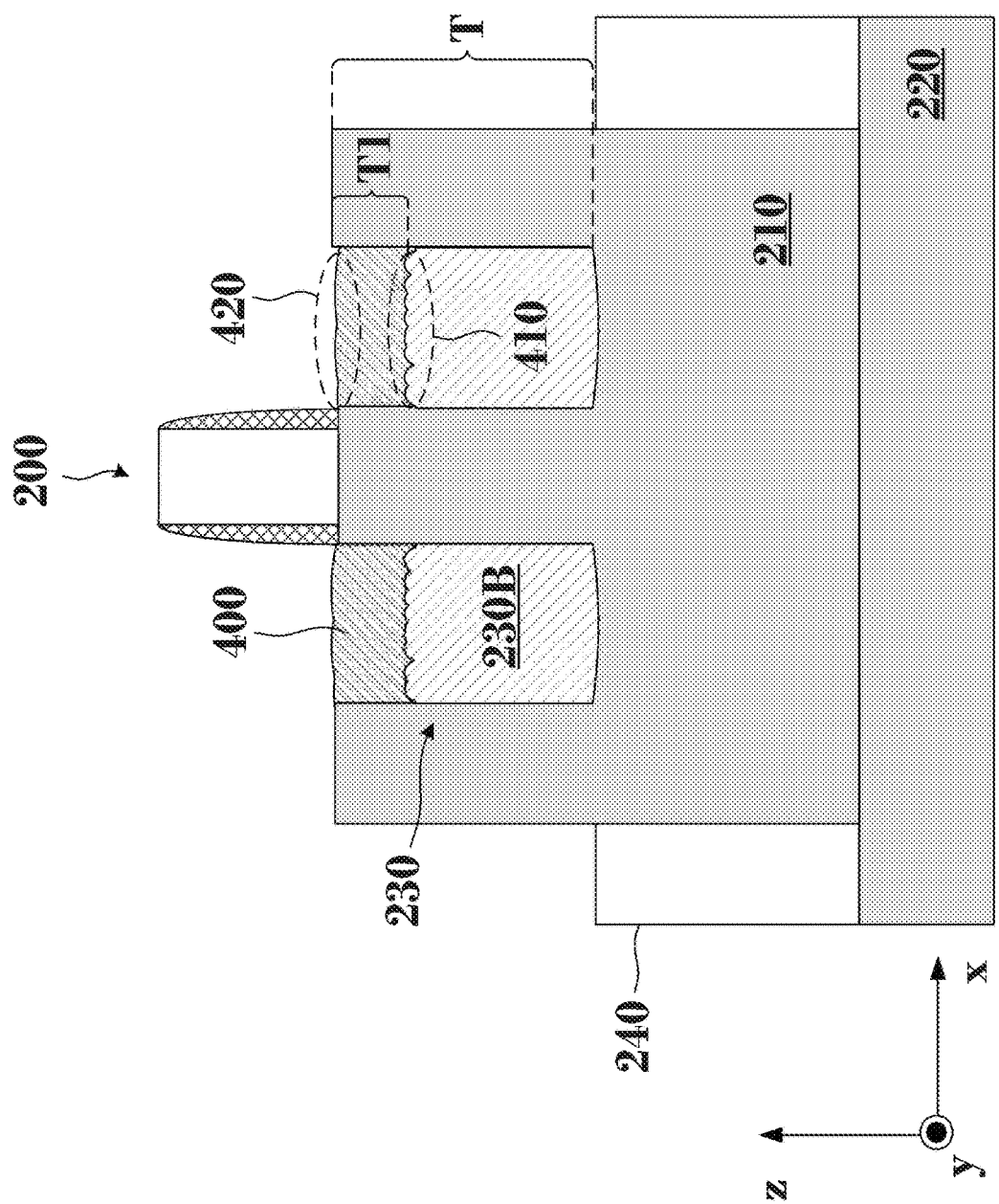
FIG. 4 is a cross-sectional view of a transistor structure having source/drain epitaxial stacks with a laser annealed single-crystalline top layer and a single-crystalline bottom layer, in accordance with some embodiments.

In some embodiments, the as-deposited amorphous low-melting point top layer 230A re-crystallizes as it cools down after the laser annealing process. For example, amorphous low-melting point top layer 230A can be converted to a single-crystalline layer. FIG. 4 shows source/drain epitaxial stack 230 after the laser annealing process described in FIG. 2, where the as-deposited amorphous low-melting point top layer 230A has been converted to a laser annealed single-crystalline top layer 400. In some embodiments, single-crystalline top layer 400 has a substantially equal thickness T1 with as-deposited amorphous low-melting point top layer 230A shown in FIG. 2. Further, thickness T of source/drain epitaxial stack 230 is substantially the same before and after the laser annealing process.

In some embodiments, interface 410 (e.g., the interface between top and bottom single-crystalline layers 400 and 230B of the laser annealed source/drain epitaxial stack) can have a rough (e.g., a coarse) surface topography, which can be detectable by transmission electron microscopy (TEM) imaging. In some embodiments, interface 410 also appears rougher (e.g., coarser) compared to top surface 420 of single-crystalline top layer 400, also detectable by TEM imaging. In some embodiments, the top surface roughness of low-melting point top layer 230A is reduced by a factor of about 6 after the laser annealing process. For example, the root mean squared (RMS) top surface roughness of low-melting point top layer 230A can be about 3 nm and the RMS top surface roughness of single-crystalline top layer 400 (e.g., the annealed top layer 230A) can be about 0.5 nm. In addition, the laser annealed single-crystalline top layer 400 has a higher defect density (e.g., number of dislocations per unit area) compared to single-crystalline high-melting point bottom layer 230B. This is due to the recrystallization process the laser annealed single-crystalline top layer 400 has undergone when transformed from an amorphous or polycrystalline layer to a single crystalline layer. For example, single-crystalline top layer 400 can have about $1 \times 10^{18}$ dislocations/cm$^2$, while single-crystalline high-melting point bottom layer 230B can have about $1 \times 10^{16}$ dislocations/cm$^2$—e.g., about two orders of magnitude fewer dislocations per unit area. In some embodiments, due to the defect density difference between the two layers in source/drain epitaxial stack 230, laser annealed single-crystalline top layer 400 develops a compressive strain, while single-crystalline high-melting point bottom layer 230B develops a tensile strain or a less compressive strain than laser annealed single-crystalline top layer 400. In other words, the strain type or the strain magnitude between laser annealed single-crystalline top layer 400 and single-crystalline high-melting point bottom layer 230B can be different.

In some embodiments, the low-melting point top layer can include a different material than the high-melting point bottom layer, or the same material but with different stoichiometry. Further, both the low-melting point top layer and the high-melting point bottom layer can be single-crystalline layers. By way of example and not limitation, in the case of a p-type source/drain epitaxial stack, the low-melting point top layer can include single-crystalline SiGe with a Ge concentration between about 20% to about 40%, while the high-melting point bottom layer can include single-crystalline Si with no appreciable amount of Ge. In some embodiments, incorporation of Ge in Si reduces the melting point of the resulting SiGe layer. For example, a SiGe layer with about 40% Ge has a lower melting point than a SiGe layer with about 20% Ge, and a SiGe layer with about 20% Ge has a lower melting point than Si that contains no appreciable amount of Ge.

In the case of an n-type source/drain epitaxial stack, the low-melting point top layer can include a single-crystalline SiC layer with a low carbon concentration, while the high-melting point bottom layer can include a single-crystalline SiC layer with a high carbon concentration—where the difference between the low and high carbon concentration is about 2%, according to some embodiments.

In some embodiments, each of the aforementioned layers are grown by CVD at a temperature range between about 650° C. and about 800° C., and at a pressure between about 20 Torr and about 300 Torr. According to some embodiments, a process temperature above about 650° C. and a process pressure below about 300 Torr is required for the growth of single-crystalline high- and low-melting point layers. As a result of the laser annealing process, both the low-melting point top layer and the high-melting point bottom layer can develop the same type of strain (e.g., compressive or tensile) and the activated dopant concentration in the single-crystalline top layer would be greater than that of the single-crystalline bottom layer. In some embodiments, the strain gain post-anneal for a compressive type of stress is about 0.8 GPa.

In other embodiments, the low-melting point top layer can include a different material than the high-melting point bottom layer, or the same material but with a different stoichiometry. Further, both the low-melting point top layer and the high-melting point bottom layer can be polycrystalline layer or amorphous layers with appropriately tuned melting points (e.g., with a melting point difference of at least 200 K). By way of example and not limitation, in the case of a p-type source/drain epitaxial stack, the low-melting point top layer can include a polycrystalline or amorphous SiGe with a Ge concentration between about 20% to about 40%, while the high-melting point bottom layer can include polycrystalline or amorphous Si with no appreciable amount of Ge. In some embodiments, incorporation of Ge in Si reduces the melting point of the resulting SiGe layer, as discussed above. For example, the melting point for an amorphous Si layer is about 1420 K while the melting point of an amorphous Ge layer is between about 965 K and 1024 K. Therefore, introducing Ge in an amorphous Si layer and controlling the Ge concentration, the melting point of the resulting layer can be tuned to be higher than about 965 K and lower than about 1420 K. Consequently, the concentration of Ge in the Si layer can be adjusted to achieve the desired melting temperature different of more than about 200 K as discussed earlier.

In the case of an n-type source/drain epitaxial stack, the low-melting point top layer can include a polycrystalline or amorphous SiC with a low carbon concentration, while the high-melting point bottom layer can include a polycrystalline or amorphous SiC with a high carbon concentration—where the difference between the low and high carbon concentration is about 2%, according to some embodiments. In some embodiments, a carbon concentration offset of about 2% is sufficient to achieve a melting point difference greater than about 200 K.

In some embodiments, the aforementioned layers are grown by CVD at a temperature range between about 450° C. and about 600° C., and at a pressure between about 300 Torr and about 400 Torr. According to some embodiments, a process temperature less than about 600° C. and a process pressure greater than about 300 Torr are required for the growth of polycrystalline or amorphous high- and low-melting point layers. As a result of the laser annealing process, both the low-melting point top layer and the high-melting point bottom layer will develop the same type of strain (e.g., compressive) and the activated dopant concentration in the top layer would be greater than that of the bottom layer. In some embodiments, the low-melting point top layer exhibits an activation rate of about 100%—e.g., all the dopants in the top layer are activated (e.g., about $1\times10^{21}$ cm$^{-3}$). In comparison, the high-melting point bottom layer may exhibit an activation rate of about 10%.

In some embodiments, any permutations of polycrystalline or amorphous and single crystalline layers can be used for the top and bottom layers of source/drain epitaxial stack and are within the spirit and the scope of this disclosure as long as the top layer has a lower melting point than the bottom layer—for example, as long as the melting point difference between bottom layer and the top layer is greater than about 200K. Further, the low-melting point top layer has between about 30% and about 75% the total thickness of the source/drain epitaxial stack.

Figure 5:
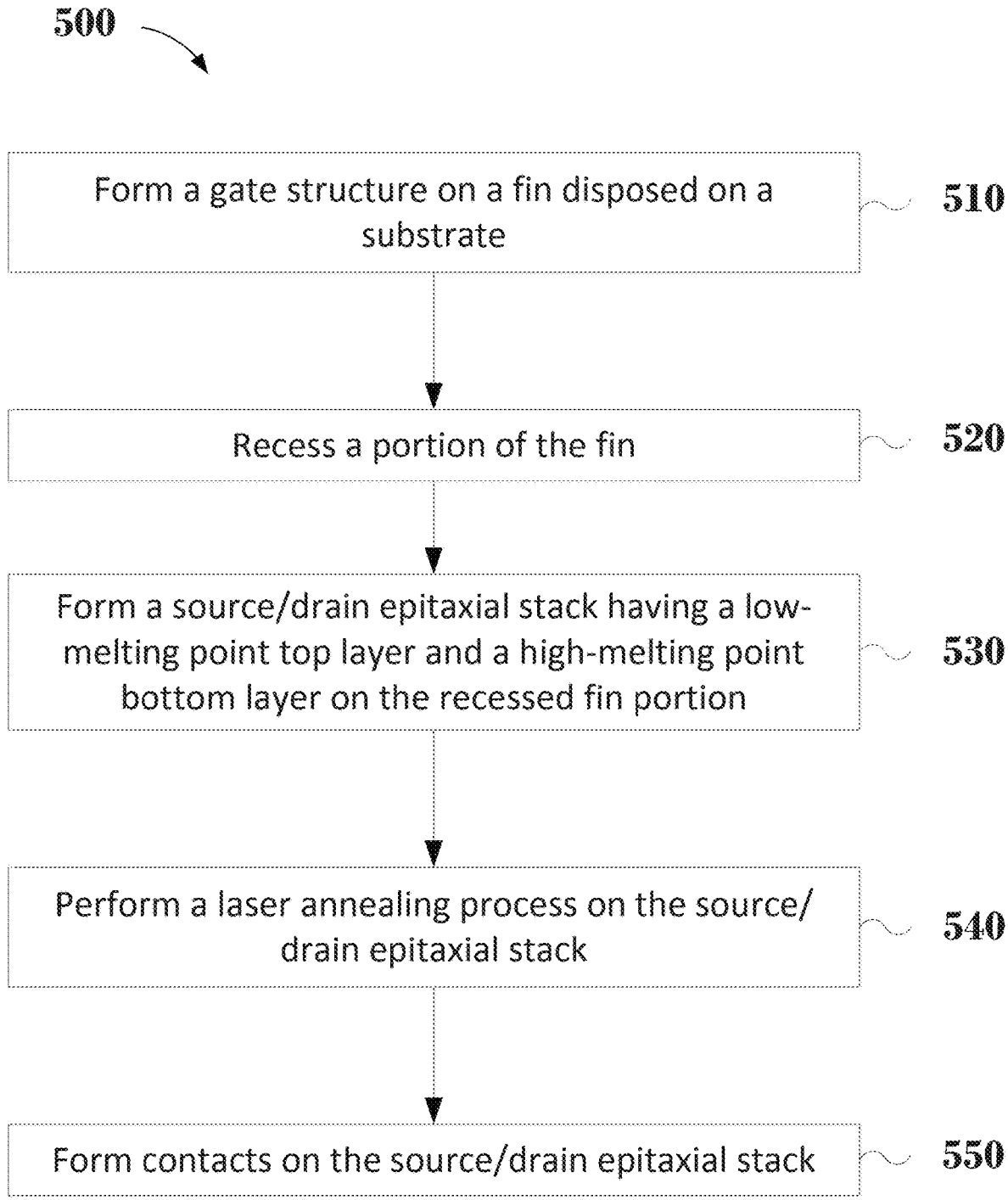
FIG. 5 is a flowchart of a method for the formation of source/drain epitaxial stacks with a low-melting point top layer and a high-melting point bottom layer, in accordance with some embodiments.

FIG. 5 is a flow chart of an exemplary method 500 for the fabrication of source/drain epitaxial stacks with a low-melting point top layer and a high-melting point bottom layer, according to some embodiments. Other fabrication operations may be performed between the various operations of method 500 and may be omitted merely for clarity. Further, the fabrication operations of method 500 are not unique and alternative operations may be performed in place of the operations in method 500. Embodiments of the present disclosure are not limited to method 500. Exemplary method 500 will be described with respect to FIGS. 6-11.

Figure 6:
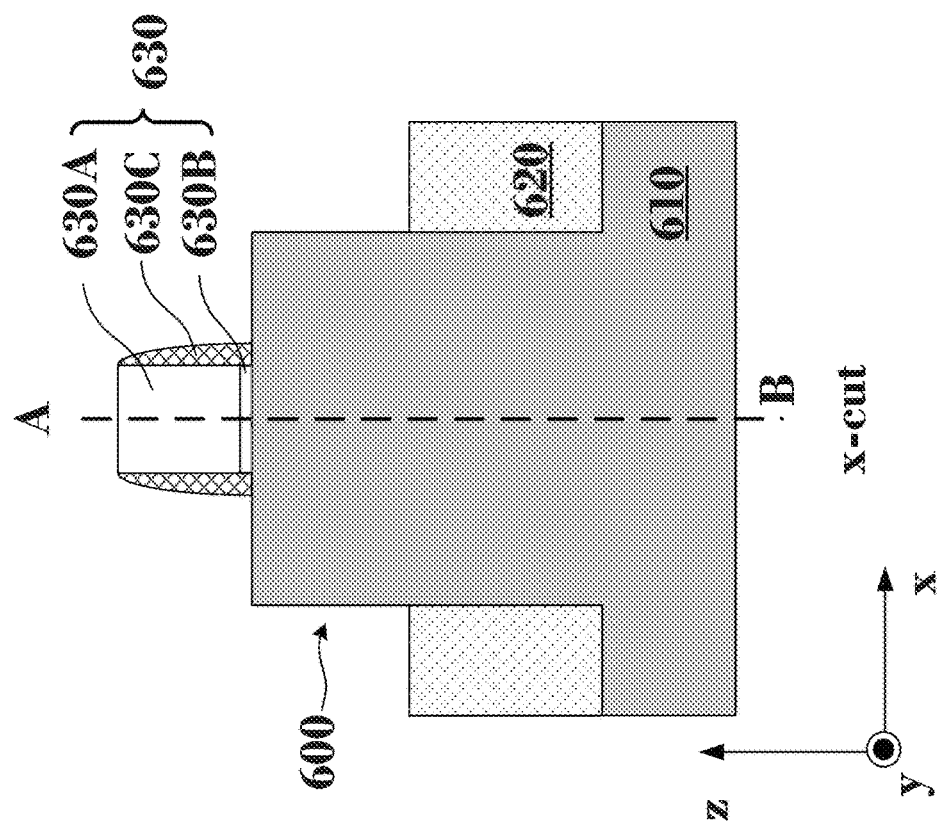
FIG. 6 is partial cross-sectional views of a transistor structure along x- and y-directions, in accordance with some embodiments.
Figure 6:
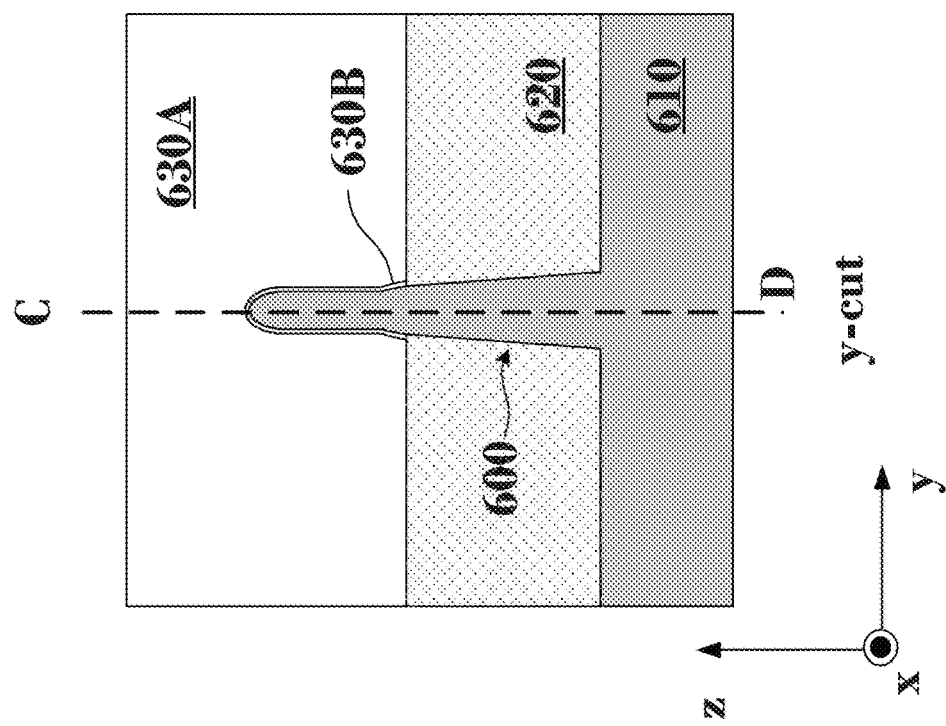

Method 500 begins with operation 510 and the formation of a gate structure on a fin that is disposed on a substrate. FIG. 6 shows cross-sectional views of the resulting structure along the x-axis (x-cut) and along the y-axis (y-cut). The direction along the x-axis coincides with the length of the fin, and the direction along the y-axis coincides with the width of the fin. For example, the y-cut view is produced by viewing the structure along line A-B of the x-cut in the y-axis direction, and the x-view is produced by viewing the structure along line C-D of the y-cut in the x-direction. According to operation 510, a fin 600 is formed on a substrate 610. In some embodiments, both fin 600 and substrate 610 include one or more semiconductor materials. For example, fin 600 and substrate 610 can include an elementary semiconductor material, such as Si or Ge, or a semiconductor compound, such as SiGe. Further, fin 600 and substrate 610 may include doped regions not shown in FIG. 6. A dielectric layer 620, such as silicon oxide, isolates fin 600 from adjacent fins. In some embodiments, dielectric layer 620 can be an isolation structure, such as a shallow trench isolation (STI) structure.

A gate structure 630 is formed on and around fin 600 so that gate structure 630 "wraps around" a portion of fin 600 not covered by dielectric layer 620, as shown by the x-cut and y-cut cross-sectional views of FIG. 6. According to some embodiments, gate structure 630 includes a sacrificial gate electrode 630A, a sacrificial gate dielectric 630B, and one or more spacer layers 630C. In some embodiments, sacrificial gate electrode 630A includes polysilicon and sacrificial gate dielectric includes silicon oxide. Further, one or more spacer layers 630C can include a nitride, such as silicon nitride. According to some embodiments, sacrificial gate electrode 630A and sacrificial gate dielectric 630B form a sacrificial gate stack that can be replaced with a metal gate stack in a subsequent operation.

Figure 7:
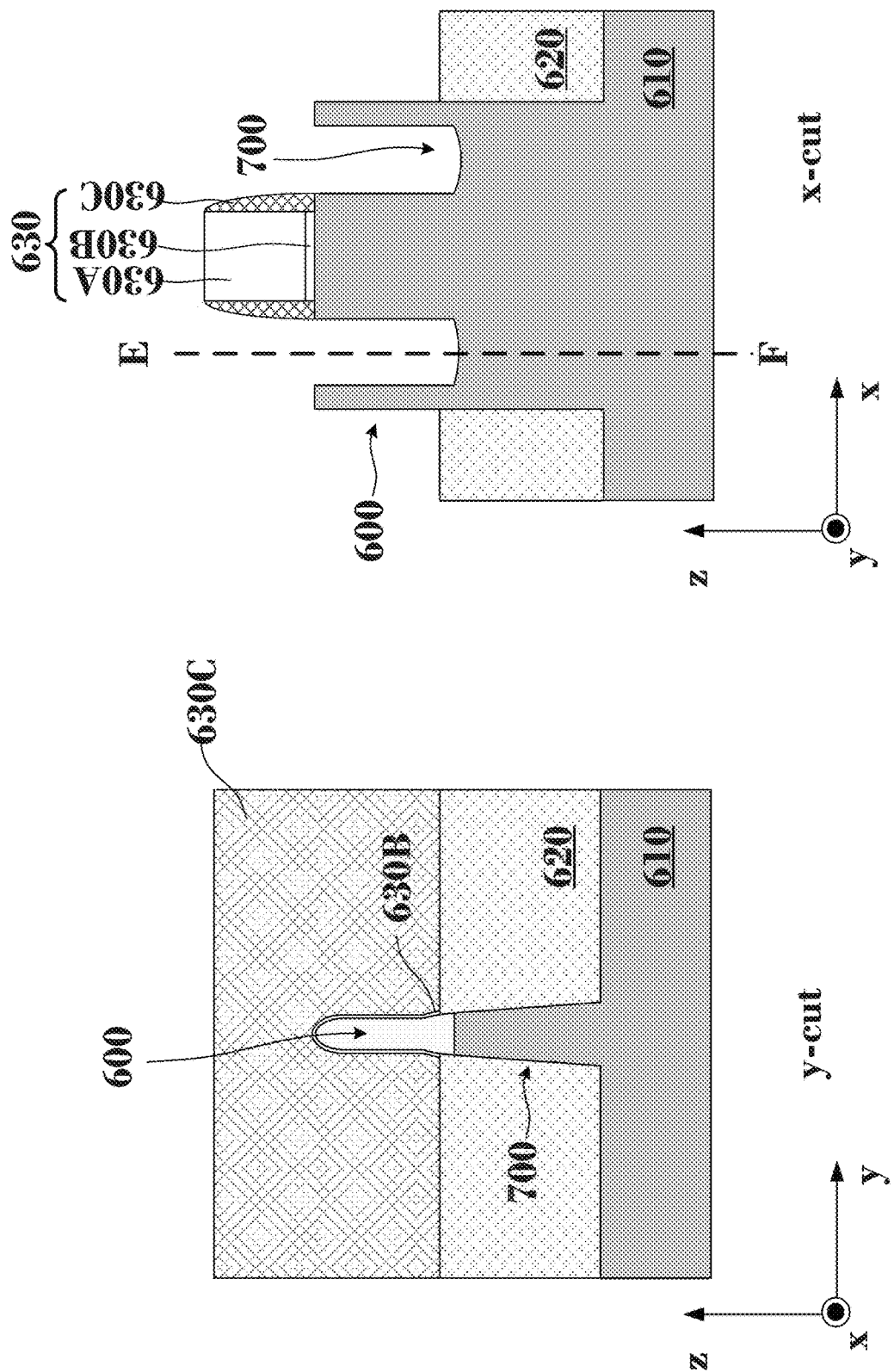
FIG. 7 is partial cross-sectional views of recessed fin portions of a transistor structure along x- and y-directions, in accordance with some embodiments.

In referring to FIG. 5, method 500 continues with operation 520, where a portion of fin 600 is recessed. According to some embodiments, recessing fin 600 facilitates the formation of the source/drain epitaxial stack in a subsequent operation (e.g., in operation 530 of method 500). By way of example and not limitation, the x-cut of FIG. 7 shows the resulting structure after the recess process of operation 520. In some embodiments, portions of fin 600 are recessed to form recessed fin portions 700. Recessed fin portions 700 are located adjacent to spacer layers 630C of gate structure 630. By way of example and not limitation, recessed fin portions 700 can be formed by masking portions of fin 600 to be protected and etching the remaining portions (e.g., the exposed portions) of fin 600. Masking can be achieved with a hard mask layer, such as an oxide layer or a nitride layer, with a photoresist layer, or combinations thereof. The etching process can include an etchant, such as chlorine ($Cl_2$), hydrogen bromide (HBr), tetrafluoromethane ($CF_4$), or combinations thereof. In some embodiments, all portions of fin 600, not covered by gate structure 630, are recessed during operation 520 as shown in the x-cut of FIG. 11. The y-cut view of FIG. 7 shows the resulting structure along line E-F of the x-cut in the y-direction. In the y-cut view, both the recessed (e.g., 700) and the non-recessed (e.g., 600) portions of the fin are visible.

In referring to FIG. 5, method 500 continues with operation 530 and the formation of a source/drain epitaxial stack having a low-melting point top layer and a high-melting point bottom layer on recessed fin portion 700. As discussed above, in some embodiments, the low-melting point top layer and the high-melting point bottom layer include materials with substantially similar stoichiometry, but different microstructure—for example, the low-melting point top layer is amorphous and the high-melting point bottom layer is single-crystalline. In this case, the melting point difference between the two layers is attributed to the different microstructure of the two layers.

In some embodiments, the low-melting point top layer and the high-melting point bottom layer include materials with a different stoichiometry, but substantially similar microstructure—for example, both the low-melting point top layer and the high-melting point bottom layer are single-crystalline layers or polycrystalline layers or amorphous layers. In this case, the melting point difference between the two layers is attributed to the different stoichiometry of the two layers. In some embodiments, the melting point difference between the high-melting point bottom layer and the low-melting point top layer is greater than about 200K. In some embodiments, the low melting point top layer has a lower melting point than the surrounding structures, such as fin 600. In some embodiments, fin 600 and high-melting point bottom layer have substantially similar melting points.

Figure 8:
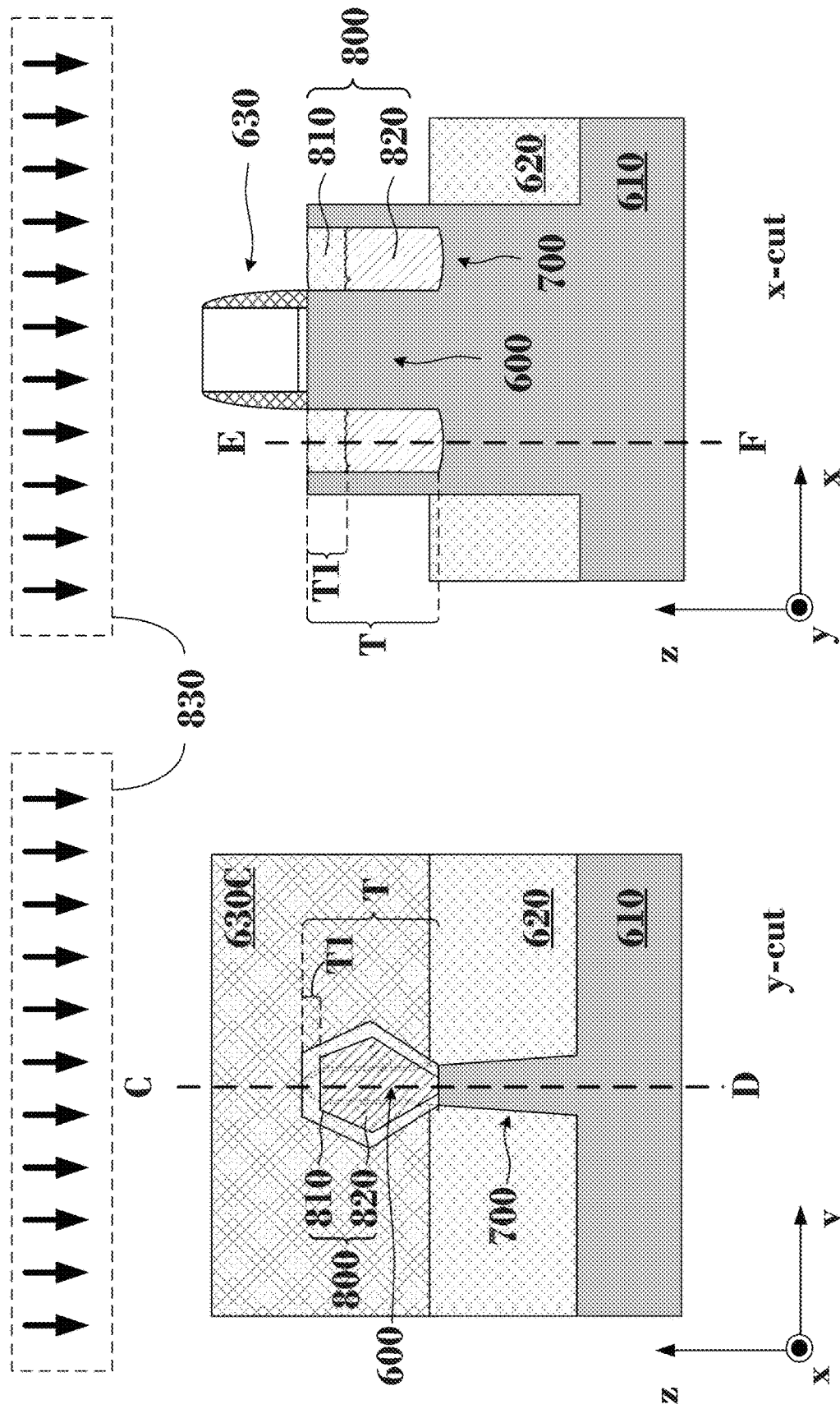
FIG. 8 is partial cross-sectional views of a transistor structure after the formation of source/drain epitaxial stacks with a low-melting point top layer and a high-melting point bottom layer on recessed portions of a fin along x- and y-directions, in accordance with some embodiments.
Figure 9:
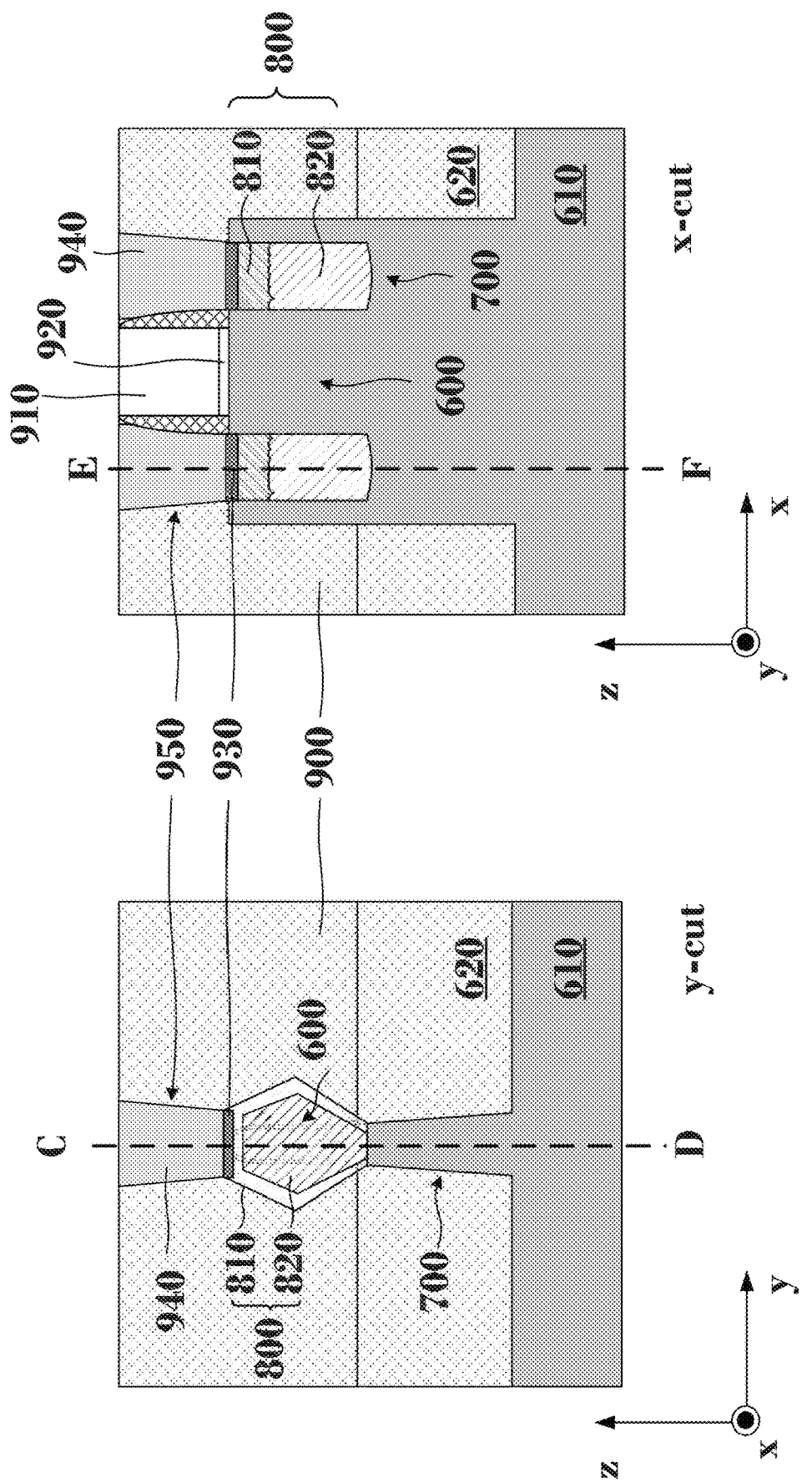
FIG. 9 is partial cross-sectional views of a transistor structure after the formation of contacts on source/drain epitaxial stacks with a low-melting point top layer and a high-melting point bottom layer along x- and y-directions, in accordance with some embodiments.
Figure 10:
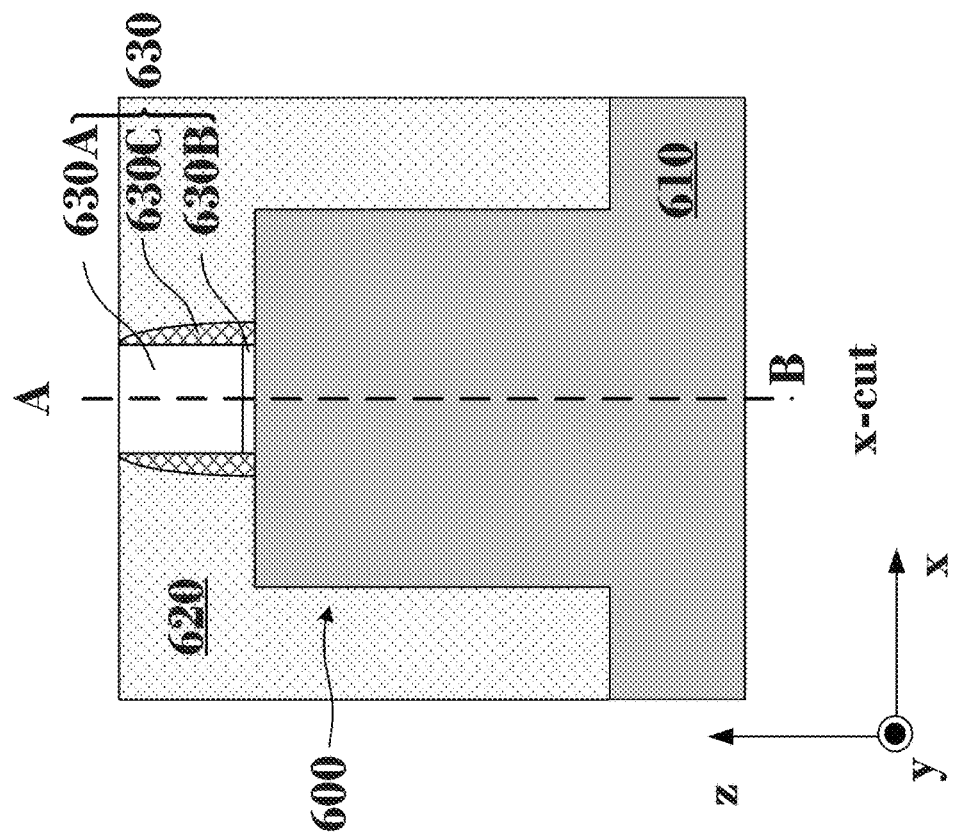
FIG. 10 is partial cross-sectional views of a transistor structure along x- and y-directions, in accordance with some embodiments.
Figure 10:
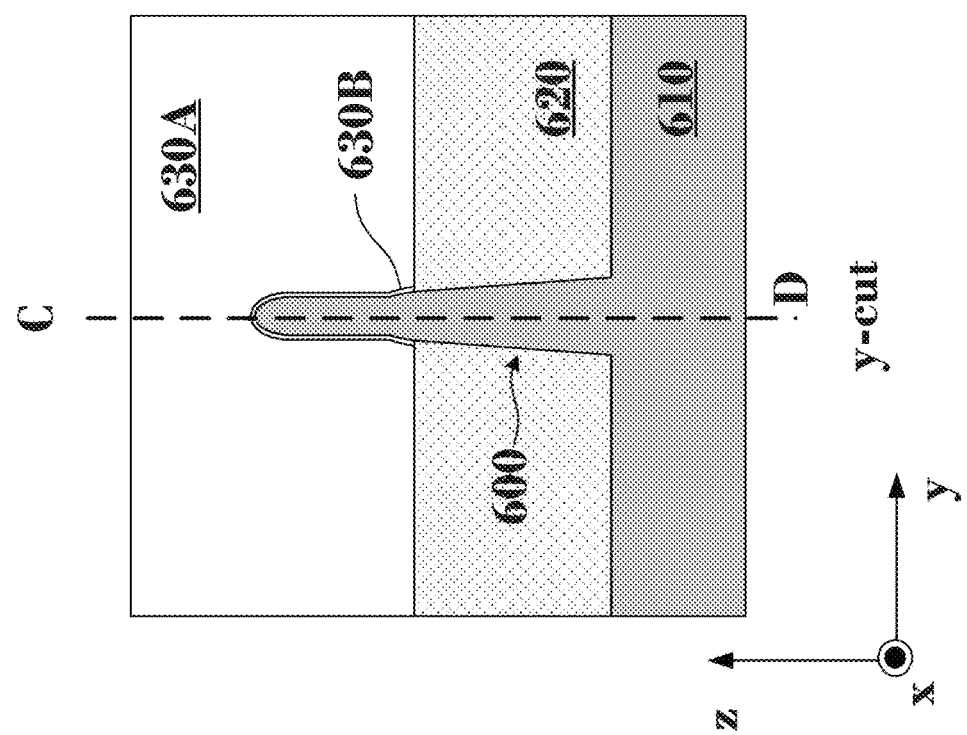

By way of example and not limitation, FIG. 8 shows x-cut and y-cut views of the resulting structure after the formation of source/drain epitaxial stack 800. The y-cut view of FIG. 8 shows the resulting structure along line E-F of the x-cut in the y-direction, and the x-cut view of FIG. 8 shows the resulting structure along line C-D of the y-cut in the x-direction. In some embodiments, source/drain epitaxial stack 800 has a diamond shape, as shown in the y-cut of FIG. 8. Source/drain epitaxial stack 800 includes low-melting point top layer 810 and high-melting point bottom layer 820. In some embodiments, high-melting point bottom layer may include additional epitaxial layers not shown in the views of FIG. 8 for simplicity. By way of example and not limitation, low-melting point top layer 810 and high-melting point bottom layer 820 are grown by a CVD process at a temperature range between 450° C. and 800° C., and at a process pressure between about 20 Torr and about 400 Torr. In some embodiments, a combination of a low temperature range (e.g., between about 450° C. and about 600° C.) and a high pressure range (e.g., between about 300 Torr and about 400 Torr) produces an amorphous or polycrystalline layer, while a combination of a high temperature range (between about 600° C. and about 800° C.) and a low pressure range (e.g., between about 20 Torr and about 300 Torr) produces a single-crystalline layer. In some embodiments, a thickness ratio between low-melting point top layer 810 and source/drain epitaxial stack 800 is between about 0.3 and about 0.75 (e.g., $0.30 \leq T1/T \leq 0.75$). In some embodiments, the laser annealing process does not change the thickness of low-melting point top layer 810 and high-melting point bottom layer 820.

In some embodiments, source/drain epitaxial stack 800 can be a B-doped SiGe stack with a Ge concentration between about 20% and about 40%, a P-doped SiC stack, or a P-doped SiP stack. In some embodiments, the dopant concentration of low-melting point top layer 810 is substantially similar to the dopant concentration of high-melting point bottom layer 820 (e.g., about $1 \times 10^{21}$ cm$^{-3}$).

Referring to FIGS. 5 and 8, method 500 continues with operation 540, where a laser annealing process anneals source/drain epitaxial stack 800 to activate the dopants. In some embodiments, a molten front is formed selectively in low-melting point top layer 810 by a passing laser beam 830. As a result of this process, low-melting point top layer 810 can obtain an activated dopant concentration of about $1 \times 10^{21}$ cm$^{-3}$ (e.g., about 100% activation rate). In some embodiments, as a result of the laser annealing process, high-melting point bottom layer 820 has a lower activated dopant concentration than low-melting point top layer 810 (e.g. an activation rate of about 10%)—for example, the activated dopant concentration of high-melting point bottom layer 820 can range between about $3 \times 10^{18}$ cm$^{-3}$ and about $1 \times 10^{20}$ cm$^{-3}$. In some embodiments, diffusion of dopants outside the source/drain epitaxial stack is prevented, as previously discussed above with respect to FIG. 3.

In some embodiments, the laser annealing process re-crystallizes low-melting point top layer 810, if low-melting point top layer 810 was an amorphous layer as-deposited. Further, the re-crystallized low-melting point top layer has a higher defect density compared to high-melting point bottom layer 820 (e.g., about 2 orders of magnitude lower). In some embodiments, the interface between low-melting point top layer 810 and high-melting point bottom layer 820 has a rough (e.g., non-planar or coarse) surface topography that is visible via TEM imaging. In some embodiments, the re-crystallized low-melting point top layer develops a compressive strain, while the high-melting point bottom layer 820 has a tensile strain or a less compressive strain compared to the re-crystallized low-melting point top layer.

Referring to FIG. 5, method 500 concludes with operation 550 and the formation of contact on source/drain epitaxial stacks 800. By way of example and not limitation the contacts can be formed as follows. In referring to FIG. 9, a dielectric layer 900 is deposited on dielectric layer 620 and is subsequently polished so that a top surface of dielectric layer 900 is substantially co-planar with a top surface of gate structure 630. In some embodiments, sacrificial gate electrode 630A and sacrificial gate dielectric 630B are replaced with a metal gate electrode stack 910 and a gate dielectric stack 920, respectively. In some embodiments, gate electrode stack 910 includes metallic layers such as work function layers (e.g., one or more titanium nitride layer), barrier layers (e.g., tantalum nitride layers), metal fill layers (e.g., tungsten metal fill), which are not shown in FIG. 9 for simplicity. In some embodiments, gate dielectric stack 920 includes an interfacial dielectric layer (e.g., silicon oxide) and a high-k dielectric layer with a dielectric constant greater than about 3.9 (e.g., hafnium oxide), both of which are not shown in FIG. 9 for simplicity.

In some embodiments, contact openings are formed in dielectric layer 900 to expose the laser annealed low-melting point top layer 810. Once laser annealed low-melting point top layer 810 is exposed, a silicide 930 can be formed on the top surface of laser annealed low-melting point top layer 810. In some embodiments, silicide 930 includes titanium, platinum, nickel, any other suitable metal, or combinations thereof. In some embodiments, a portion of laser annealed low-melting point top layer 810 is consumed to form silicide 930. Subsequently the contact opening is coated with a liner layer, such as titanium nitride. The liner layer is not shown in FIG. 9 for simplicity. The liner layer functions as an adhesion and barrier layer for metal fill 940. In some embodiments, metal fill 940 and the liner layer (not shown in FIG. 10) are planarized to remove deposited material from the top surface of dielectric layer 900 and form contacts 950.

Figure 11:
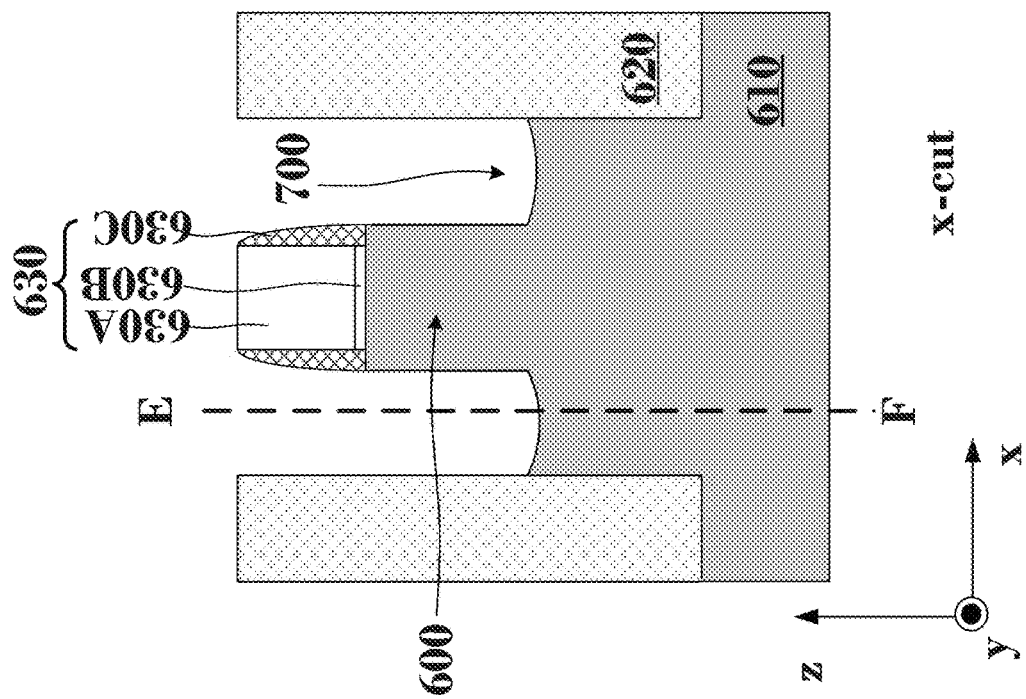
FIG. 11 is partial cross-sectional views of recessed fin portions of a transistor structure along x- and y-directions, in accordance with some embodiments.
Figure 11:
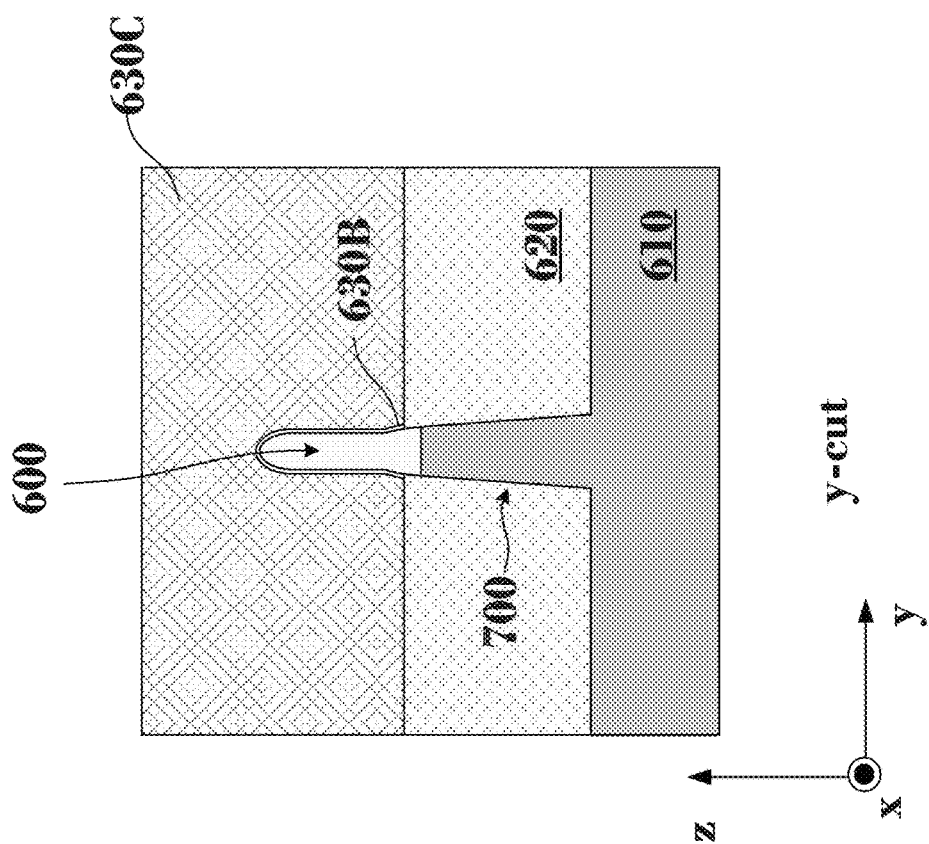

In some embodiments, method 500 can be applied to a different transistor structure from the one shown in FIGS. 6-9. For example, in referring to FIG. 6, dielectric layer 620 can be grown so that its top surface is coplanar with a top surface of gate structure 630, as shown in the x-cut of FIG. 10. In some embodiments, the transistor structure shown in FIG. 10 can be a variant of the transistor structure shown in FIG. 6. In the transistor structure of FIG. 10, dielectric layer 620 may cover the sidewall and top surfaces of fin 600 and spacer layers 630C of gate structure 630. In this exemplary transistor structure, fin 600 is recessed according to operation 520 of FIG. 5 between gate structure 630 and dielectric layer 620 as shown from the x-cut of FIG. 11. For example, openings in dielectric layer 620 can be formed on either side of gate structure 630 to expose portions of fin 600 not covered by gate structure 630. The y-cut of FIG. 11 shows a view of the structure along line E-F of the x-cut of FIG. 11. By way of example and not limitation, this can be achieved with photolithography and etching operations. Subsequently, fin 600 can be recessed as described for FIG. 7. Other operations of method 500 (e.g., 530-550) are performed without changes.

The embodiments described herein are directed to the formation of source/drain epitaxial stacks with a low-melting point top layer and a high-melting point bottom layer. In some embodiments, the low-melting point top layer and the high-melting point bottom layer include materials with substantially similar stoichiometry, but different microstructure—for example, the low-melting point top layer can be amorphous and the high-melting point bottom layer can be single-crystalline. In such case, the melting point difference between the two layers is attributed to the different microstructure between the two layers. In other embodiments, the low-melting point top layer and the high-melting point bottom layer include materials with different stoichiometry, but substantially similar microstructure—for example, both the low-melting point top layer and the high-melting point bottom layer can be single-crystalline layers or polycrystalline layers or amorphous layers. In this case, the melting point difference between the two layers is attributed to the different stoichiometry between the two layers. According to some embodiments, the melting point difference between the high-melting point bottom layer and the low-melting point top layer, regardless of its origin (e.g., microstructure or stoichiometry), is greater than 200 K. In some embodiments, after the laser annealing process, the low-melting point top layer and the high-melting point bottom layer can have a different strain type and/or different strain magnitude. In some embodiments, a combination of low growth temperature (e.g., between about 450° C. and about 600° C.) with a high growth pressure (e.g., between about 300 Torr and about 400 Torr) produces an amorphous or polycrystalline layer, while a combination of high growth temperature (between about 600° C. and about 800° C.) with a low growth pressure (e.g., between about 20 Torr and about 300 Torr) produces a single-crystalline layer. According to some embodiments, a thickness ratio between the low-melting point top layer and the source/drain epitaxial stack is between about 0.3 and 0.75 (e.g., 0.3≤thickness ratio≤0.75). In some embodiments, the laser annealing process does not substantially change the thickness of the low-melting point top layer and the high-melting point bottom layer. In some embodiments, the low melting point top layer has a lower melting point than the surrounding structures, such as a semiconductor fin or a semiconductor substrate-therefore fin deformation can be avoided during the laser annealing process. In some embodiments, the as-deposited amorphous low-melting point top layer re-crystallizes as a result of the laser annealing process and develops a higher defect density compared to the high-melting point bottom layer. Further, the low-melting point top layer, as a result of the laser annealing process, exhibits a higher activated dopant concentration than the high-melting point bottom layer.

In some embodiments, a semiconductor structure includes a fin disposed on a substrate, where the fin and the substrate include a semiconductor material. The semiconductor structure further includes a gate structure disposed on the fin, where the gate structure wraps around a portion of a side wall surface of the fin. Additionally, the semiconductor structure includes a recess formed in a portion of the fin and adjacent to the gate structure; and a source/drain epitaxial stack disposed in the recess having a bottom layer and a top layer with a higher activated dopant concentration than the bottom layer. Finally, the semiconductor structure includes a contact disposed on the top layer of the source/drain epitaxial stack and adjacent to the gate structure.

In some embodiments, a method includes forming a fin on a substrate; forming a sacrificial gate structure on the fin that wraps around a portion of a top surface of the fin and a portion of a sidewall surface of the fin; recessing a portion of the fin not covered by the sacrificial gate structure; forming a source/drain epitaxial stack in the recessed portion of the fin, where forming the source/drain epitaxial stack includes: growing a bottom layer with a crystalline microstructure and growing a top layer with an amorphous microstructure on the bottom layer, where the top layer has a different melting point than the bottom layer. The method further includes annealing, with a laser, the source/drain epitaxial stack to form a molten front in the top layer.

In some embodiments, a method includes forming a fin on a substrate and a gate structure on the fin. The method further includes recessing portions of the fin not covered by the gate structure and forming a source/drain epitaxial stack on recessed portions of the fin; where forming the source/drain epitaxial stack includes: depositing a first layer having first dopants and depositing a second layer having second dopants, where the second layer is disposed on the first layer and has a lower melting point than the first layer. The method also includes exposing the source/drain epitaxial stack to an annealing source to activate the first and second dopants in the first and second layers.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a fin disposed on a substrate, wherein the fin and the substrate comprise a semiconductor material;
   a gate structure disposed on the fin, wherein the gate structure wraps around a portion of a sidewall surface of the fin;
   a recess formed in a portion of the fin adjacent to the gate structure;
   a source/drain epitaxial stack disposed in the recess, wherein a difference between a dopant concentration of the source/drain epitaxial stack and a carrier concentration of the source/drain epitaxial stack increases in a vertical direction towards the substrate; and
   a contact disposed on a top layer of the source/drain epitaxial stack, wherein the contact is adjacent to the gate structure.

2. The semiconductor structure of claim 1, wherein the top layer has an activated dopant concentration of about 100% and a bottom layer of the source/drain epitaxial stack has an activated dopant concentration of about 10%.

3. The semiconductor structure of claim 1, wherein the top layer has two orders of magnitude higher defect density than a bottom layer of the source/drain epitaxial stack.

4. The semiconductor structure of claim 1, wherein a thickness of the top layer is between about 30% and about 75% of that of the source/drain epitaxial stack.

5. The semiconductor structure of claim 1, wherein the top layer induces to the fin a higher compressive stress than a bottom layer of the source/drain epitaxial stack.

6. The semiconductor structure of claim 1, wherein the top layer has an activated dopant concentration of about $1 \times 10^{21}$ cm$^{-3}$.

7. The semiconductor structure of claim 1, wherein each of a bottom layer of the source/drain epitaxial stack and the top layer comprises boron-doped silicon-germanium, phosphorous-doped silicon-carbon, or phosphorous-doped silicon-phosphorous.

8. A structure, comprising:
a fin on a substrate, the fin having a recessed portion;
a gate structure on the fin, wherein the gate structure wraps around a portion of a top surface of the fin and a portion of a sidewall surface of the fin;
a source/drain epitaxial stack in the recessed portion of the fin, the source/drain epitaxial stack comprising:
a bottom layer having a crystalline microstructure; and
a top layer disposed on the bottom layer, wherein a roughness of an interface between the top layer and the bottom layer is greater than a roughness of a top surface of the top layer.

9. The structure of claim 8, wherein the recessed portion of the fin is not covered by the gate structure.

10. The structure of claim 8, wherein the top layer has a lower melting point than that of the fin.

11. The structure of claim 8, wherein the top layer has a single-crystalline microstructure.

12. The structure of claim 8, wherein the top layer has a defect density about two orders of magnitude greater than that of the bottom layer.

13. The structure of claim 8, wherein the top layer has a higher compressive stress than that of the bottom layer.

14. The structure of claim 8, wherein a thickness of the top layer is between about 30% and about 75% of the thickness of the source/drain epitaxial stack.

15. The structure of claim 8, wherein melting points of the top and bottom layers differ by more than about 200 K.

16. The structure of claim 8, wherein the top layer is a crystalline layer having a higher activated dopant concentration than that of the bottom layer.

17. A structure, comprising:
a fin on a substrate, the fin having recessed portions and non-recessed portions;
a gate structure covering the non-recessed portions; and
a source/drain epitaxial stack on recessed portions, the source/drain epitaxial stack comprising:
a first layer having a first activated carrier concentration less than a chemical dopant concentration of the first layer; and
a second layer disposed on the first layer, the second layer having a second activated carrier concentration substantially equal to a chemical dopant concentration of the second layer.

18. The structure of claim 17, wherein the first layer has fewer dislocations than the second layer.

19. The structure of claim 17, wherein the first and the second layers are both crystalline and include different silicon compounds comprising one or more of SiGe, SiC, and SiP.

20. The structure of claim 18, wherein the first layer has a tensile strain, the second layer has a compressive strain, and the first and second layers are made of a same silicon compound comprising one or more of SiGe, SiC, and SiP.

\* \* \* \* \*